US011651962B2

(12) United States Patent
Lee et al.

(10) Patent No.: US 11,651,962 B2
(45) Date of Patent: May 16, 2023

(54) METHOD OF FORMING PATTERNS USING REVERSE PATTERNS

(71) Applicant: SK hynix Inc., Gyeonggi-do (KR)

(72) Inventors: Jung Hyung Lee, Gyeonggi-do (KR); Sarohan Park, Gyeonggi-do (KR); Ju Ry Song, Gyeonggi-do (KR); Ji Young Im, Gyeonggi-do (KR); Sang Hee Jung, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 296 days.

(21) Appl. No.: 17/154,298

(22) Filed: Jan. 21, 2021

(65) Prior Publication Data

US 2022/0005695 A1 Jan. 6, 2022

(30) Foreign Application Priority Data

Jul. 2, 2020 (KR) ........................ 10-2020-0081787

(51) Int. Cl.
*H01L 21/033* (2006.01)
*H01L 21/027* (2006.01)
*H01L 21/311* (2006.01)
*H01L 27/108* (2006.01)

(52) U.S. Cl.
CPC ...... *H01L 21/0337* (2013.01); *H01L 21/0274* (2013.01); *H01L 21/0332* (2013.01); *H01L 21/31144* (2013.01); *H01L 27/10894* (2013.01)

(58) Field of Classification Search
CPC ..... H01L 21/033; H01L 21/02; H01L 21/311; H01L 27/10894
See application file for complete search history.

(56) References Cited

U.S. PATENT DOCUMENTS

2018/0286692 A1\* 10/2018 Chen et al. ......... H01L 21/2088
2019/0035631 A1\* 1/2019 Chang et al. ......... H01L 21/033

FOREIGN PATENT DOCUMENTS

KR 10-2010-0078716 7/2010
KR 10-2016-0085043 7/2016
KR 105762070 A \* 7/2016 ............ H01I 21/308

\* cited by examiner

*Primary Examiner* — Allen L Parker
*Assistant Examiner* — David Paul Sedorook
(74) *Attorney, Agent, or Firm* — IP & T Group LLP

(57) ABSTRACT

In a method of forming patterns, first and second upper reverse patterns are formed on a lower reverse layer. A buffer layer is formed to fill first opening portions provided by the first upper reverse pattern. A shield pattern is formed to cover a second region of the buffer layer. An etching process is performed using the shield pattern and the first upper reverse pattern as an etching mask to form first lower reverse patterns providing second openings overlapping first openings, a buffer layer pattern and a second lower reverse pattern overlapping the shield pattern. A hard mask layer is formed and etched to separate hard mask layer first patterns filling the first and second openings. An etching process is performed using the hard mask layer first patterns and the second upper reverse patterns as etching masks to form third lower reverse patterns overlapping the second upper reverse pattern.

20 Claims, 18 Drawing Sheets

METHOD OF FORMING PATTERNS USING REVERSE PATTERNS

CROSS-REFERENCE TO RELATED APPLICATIONS

The present application claims priority under 35 U.S.C 119(a) to Korean Application No. 10-2020-0081787, filed on Jul. 2, 2020, 2020, which is incorporated herein by reference in its entirety.

BACKGROUND

1. Technical Field

The present disclosure generally relates to a method of fabricating a semiconductor device and, more particularly, to a method for forming patterns using reverse patterns.

2. Related Art

When integrating integrated circuits into a semiconductor substrate, it is desired to integrate a larger number of patterns in a limited area. As the degree of integration of semiconductor devices increases, it is desired to construct integrated circuits with smaller-sized fine patterns. Various processes have been attempted to form dense fine patterns having a nanoscale critical dimension (CD). Processes capable of patterning a dense arrangement of fine patterns in one region and patterning patterns having a shape different from the fine pattern have been attempted in neighboring regions. In order to pattern smaller sized fine patterns, an attempt is made to use a hard mask structure composed of a composite layer including several material layers rather than a single layer as an etching mask.

SUMMARY

An aspect of the present disclosure presents a method of forming patterns. The method for forming patterns may include: sequentially forming a first hard mask layer, a lower reverse layer, and an upper reverse layer on a semiconductor substrate including first and second regions; patterning the upper reverse layer into first upper reverse patterns positioned on the first region and providing first opening portions and second upper reverse patterns positioned on the second region; forming a buffer layer covering the first and second upper reverse patterns; forming a shield pattern opening a first portion of the buffer layer, positioned on the first region, and covering a second portion of the buffer layer, positioned on the first region; patterning the lower reverse layer and the buffer layer into first lower reverse patterns providing second opening portions respectively overlapping with the first opening portions, and a buffer layer pattern and a second lower reverse pattern overlapping with the shield pattern; forming a second hard mask layer covering the first upper reverse patterns and the buffer layer pattern; etching the second hard mask layer to form a second hard mask layer first patterns filling the first and second opening portions, and a second hard mask layer second pattern filling a space between the first upper reverse pattern and the buffer layer pattern; and selectively removing the first upper reverse patterns.

The method for forming patterns according to another aspect of the present disclosure may include: sequentially forming an upper reverse layer including first and second regions on a lower reverse layer; patterning the upper reverse layer into first upper reverse patterns providing first opening portions and positioned on the first region, and second upper reverse patterns positioned on the second region; forming a buffer layer filling the first opening portions and covering the first and second upper reverse patterns; forming a shield pattern opening a first portion positioned on the first region of the buffer layer and covering a second portion positioned on the second region of the buffer layer; sequentially removing the first portion of the buffer layer and some portions of the lower reverse layer using the shield pattern and the first upper reverse patterns as a first etching mask to form first lower reverse patterns providing second opening portions overlapping with the first opening portions and a buffer layer pattern and a second lower reverse pattern overlapping with the shield pattern; forming a hard mask layer filling the first and second opening portions and covering the first upper reverse pattern and the buffer layer pattern; removing some portions of the hard mask layer to expose the first upper reverse pattern to separate hard mask layer first patterns filling the first and second portions and hard mask layer second pattern filling a space between the first upper reverse pattern and the buffer layer pattern from the hard mask layer; selectively removing the first upper reverse pattern; and removing the first lower reverse patterns, the buffer layer pattern and some portions of the second lower reverse pattern using the hard mask layer first patterns, the hard mask layer second pattern, and the second upper reverse patterns as a second etching mask to pattern third lower reverse patterns overlapping with the second upper reverse patterns from the second lower reverse pattern.

DETAILED DESCRIPTION

Figure 1:
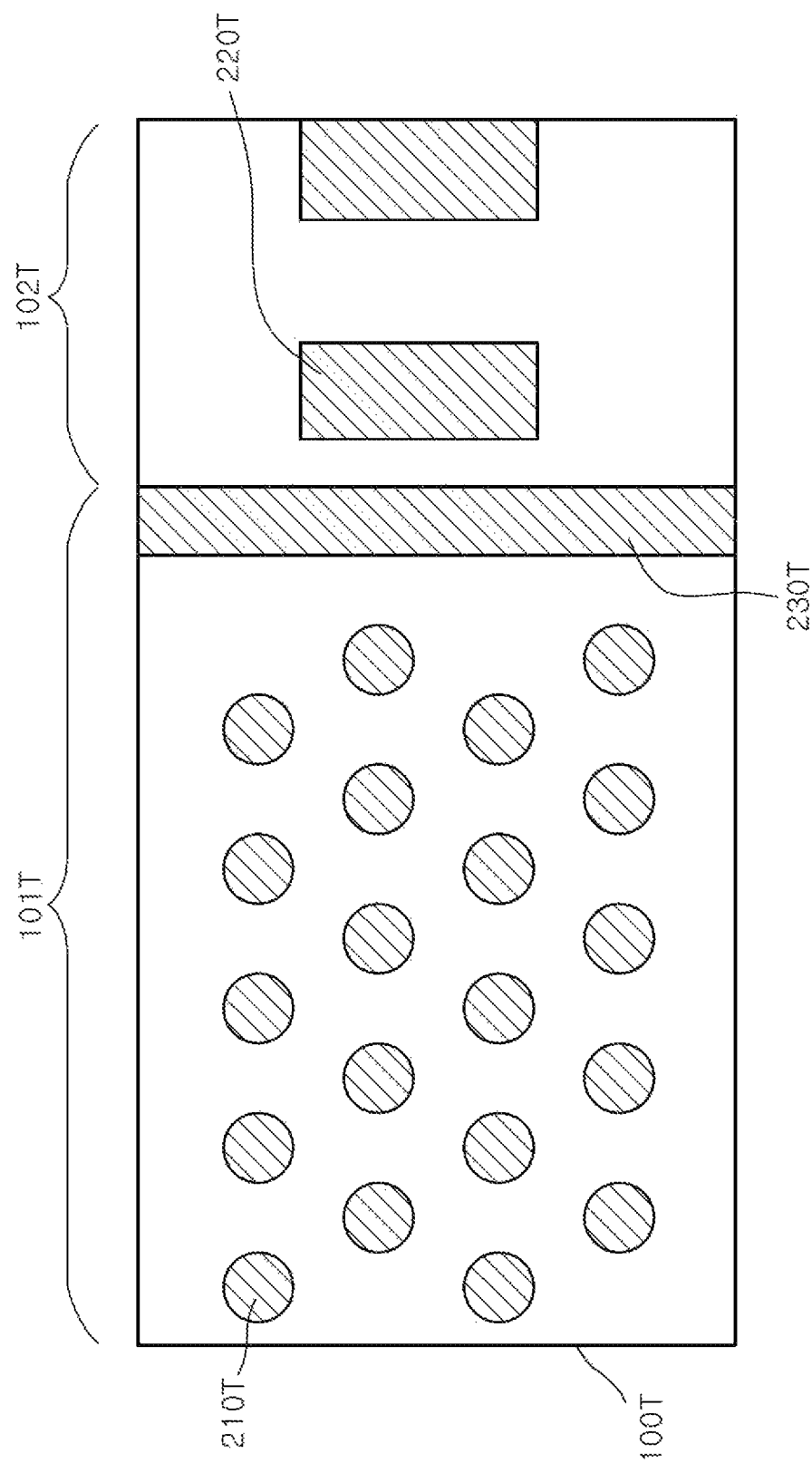
FIG. 1 is a plan view schematically illustrating a layout of target patterns according to an embodiment of the present disclosure.

The meanings of the terms used in the various embodiments may be construed according to commonly understood meanings by one with ordinary skill in the art to which the embodiments belong. Unless otherwise defined, the terms used herein have the same meaning as commonly understood by one of ordinary skill in the art to which the embodiments belong.

In the description of the examples of the present disclosure, the terms such as "first" and "second", "top" and "bottom or lower" are intended to distinguish the elements, but are not used to limit the elements or to mean specific order. These terms mean a relative positional relationship, but do not limit the specific case where another element is further introduced at or directly in contact with the element. The same interpretation can be applied to other expressions describing the relationship between elements.

Hereinafter, various examples of embodiments will be described below with reference to the accompanying drawings. Various examples of the embodiments are described herein with reference to cross-sectional illustrations that are schematic illustrations of the various examples of the embodiments and intermediate structures. As such, variations from the shapes of the illustrations as a result, for example, of manufacturing techniques and/or tolerances, are to be expected. Thus, the embodiments should not be construed as limited to the particular shapes of regions illustrated herein but may be construed to include deviations in shapes that result, for example, from manufacturing. In the drawings, lengths and sizes of layers and regions may be exaggerated for clarity. Like reference numerals in the drawings may denote like elements. It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example of the term "below" can encompass both an orientation of above and below. The device may be otherwise oriented (rotated 90 degrees or at other orientations) and the spatially relative descriptors used herein should be interpreted accordingly.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

Embodiments of the present disclosure may be applied to a technical field for implementing integrated circuits such as dynamic random-access memory (DRAM) devices, phase change random access memory (PcRAM) devices, or resistive random-access memory (ReRAM) devices. In addition, embodiments of the present disclosure may be applied to a technical field for implementing memory devices such as static random access memory (SRAM) devices, flash memory devices, magnetic random access memory (MRAM) devices or ferroelectric random access memory (FeRAM) devices, or a technical field for implementing a logic device in which a logic integrated circuit is integrated. Embodiments of the present disclosure may be applied to a technical field for implementing various products requiring fine patterns.

The same reference numerals refer to same elements throughout the specification. Even though a reference numeral is not mentioned or described with reference to a drawing, the reference numeral may be mentioned or described with reference to another drawing. In addition, even though a reference numeral is not shown in a drawing, it may be mentioned or described with reference to another drawing.

FIG. 1 is a plan view schematically illustrating a layout 100T of target patterns 210T, 220T, and 230T according to an embodiment.

Referring to FIG. 1, in the method of forming patterns according to an embodiment, the first target patterns 210T may be formed as fine-sized patterns in a first region 101T, and the second target patterns 220T having different shapes from the first target patterns 210T may be formed in a second region 102T adjacent to the first region 101T.

The first target patterns 210T may be formed to have the same shape and line width each other. Each of the first target patterns 210T may be formed in a pillar shape. The first target patterns 210T may be arranged in a denser arrangement than the second target patterns 220T. The first target patterns 210T may be patterns for forming memory cells of a DRAM device. The first region 101T may be understood as a cell region of a DRAM device. The second target patterns 220T may be patterns for configuring peripheral circuits of a DRAM device. Each of the second target patterns 220T may be formed as a pattern having a rectangular planar shape when viewed from a plane, such as a pad. The second region 102T may be understood as a peripheral region of a DRAM device. Each of the first target patterns 210T may be formed to have a smaller line width than each of the second target patterns 220T.

The third target pattern 230T may be formed as a pattern having a bar shape that extends along the boundary between the first region 101T and the second region 102T. The third target pattern 230T may be understood as a cell guard pattern that protects the arrangement of the first target patterns 210T from the outside. The third target pattern 230T may be formed to have a larger line width size than the first target pattern 210T.

FIGS. 2 to 18 are views schematically illustrating processes of a method for forming patterns according to an embodiment of implementing the target patterns 210T, 220T, and 230T of FIG. 1.

Figure 2:
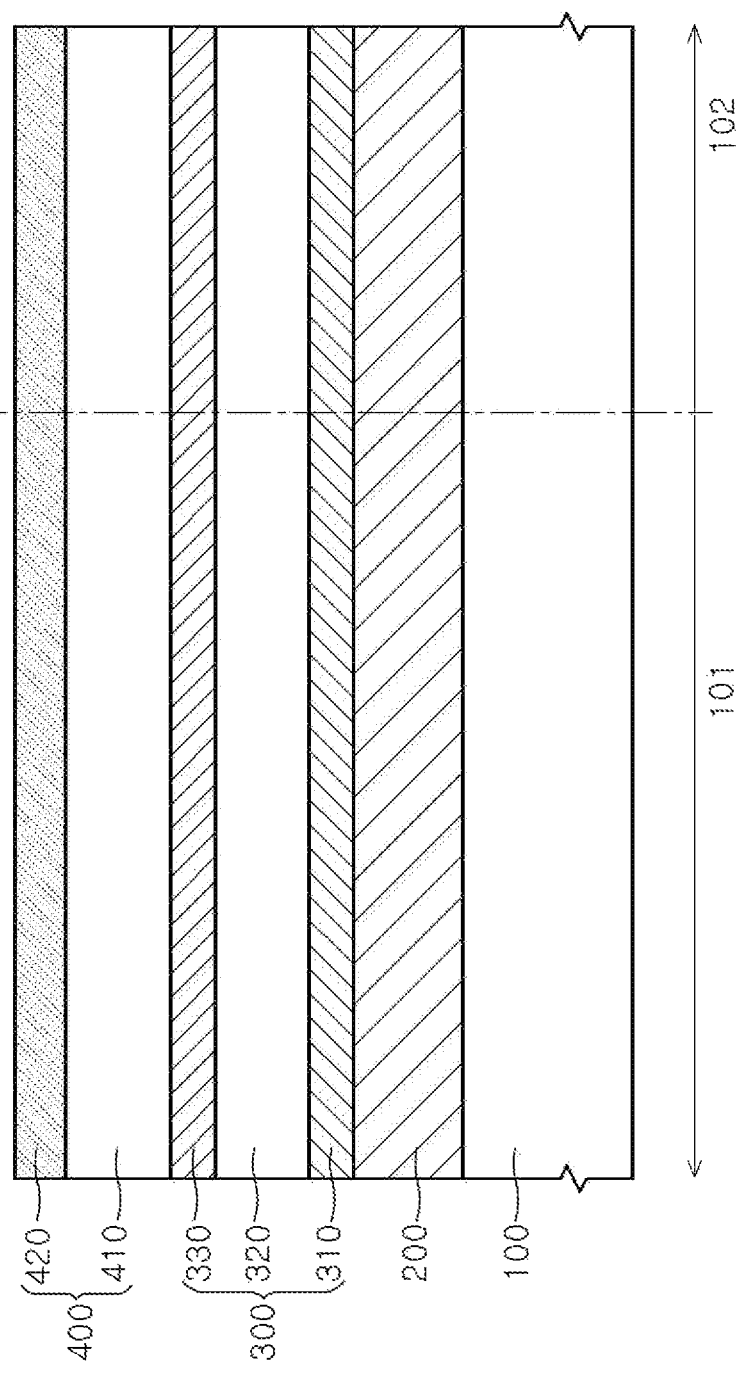
FIGS. 2 to 18 are views schematically illustrating a method of forming patterns according to an embodiment of the present disclosure.

FIG. 2 is a cross-sectional view schematically illustrating a process of forming a reverse layer 400 in a method for forming patterns according to an embodiment of the present disclosure.

Referring to FIG. 2, a semiconductor substrate 100 may be introduced as a base to which the method of forming patterns is performed. For example, the semiconductor substrate 100 may be a silicon wafer. The semiconductor substrate 100 may include a first region 101, and a second region 102 adjacent to the first region 101. Various layers to be formed on the semiconductor substrate 100 may include a portion corresponding to the first region 101 and another portion corresponding to the second regions 102. For example, an upper reverse layer 420 to be formed on the semiconductor substrate 100 may be introduced as a layer including the first region and the second region.

A target layer 200 and a first hard mask layer 300 may be sequentially formed on the semiconductor substrate 100. The target layer 200 may be formed as a layer to be patterned into the target patterns 210T, 220T, and 230T in FIG. 1. The target layer 200 may include a layer of an insulating material or a layer of a dielectric material such as silicon oxide (SiO2). In another embodiment, the target layer 200 may include a conductive layer. The target layer 200 may be formed to have a thickness of several hundreds Å to several thousands Å.

The first hard mask layer 300 may be formed on the target layer 200. The first hard mask layer 300 may be formed as a layer to be patterned into a first hard mask layer pattern. The first hard mask layer pattern may be used as an etching mask for a selective etch in a process of patterning the target layer 200 into the target patterns 210T, 220T, and 230T. The first hard mask layer 300 may include a material that can have etch selectivity with respect to the target layer 200 in the etching process. The first hard mask layer 300 may include a material that can have a different etch rate from the target layer 200 in the etching process. The first hard mask layer 300 may include a material that can have a relatively low etch rate than the target layer 200 in the etching process.

The first hard mask layer 300 may include a composite layer in which layers of different materials are stacked. The first hard mask layer 300 may be disposed in a structure in which a first sub-layer 310, a second sub-layer 320, and a third sub-layer 330 of the first hard mask layer are stacked. The first sub-layer 310 of the first hard mask layer may be made of or include a lower silicon nitride ($Si_3N_4$) layer. The third sub-layer 330 of the first hard mask layer may be made of or include an upper silicon nitride ($Si_3N_4$) layer. The second sub-layer 320 of the first hard mask layer may be positioned between the first and third sub-layers 310 and 330 of the first hard mask layer. The second sub-layer 320 of the first hard mask layer may include a different dielectric material from the first and third sub-layers 310 and 330 of the first hard mask layer. The second sub-layer 320 of the first hard mask layer may include, for example, amorphous carbon layer 320.

The first and third sub-layers 310 and 330 of the first hard mask layer may be formed of the same material and may have substantially the same thickness. The first and third sub-layers 310 and 330 of the first hard mask layer may be formed to have a thickness of several hundreds Å. The first sub-layer 310 of the first hard mask layer may be formed to have a thickness of approximately 200 Å or so. The third sub-layer 330 of the first hard mask layer may be formed to a thickness of approximately 300 Å or so. The second sub-layer 320 of the first hard mask layer may be formed to have a greater thickness than the first and third sub-layers 310 and 330 of the first hard mask layer. The second sub-layer 320 of the first hard mask layer may be formed to have a thickness of several thousands Å. For example, the second sub-layer 320 of the first hard mask layer may be formed to have a thickness of approximately 1000 Å to 1400 Å.

A reverse layer 400 may be formed on the first hard mask layer 300. The reverse layer 400 may be formed as a composite layer in which at least two or more material layers are stacked. A lower reverse layer 410 and an upper reverse layer 420 may be sequentially formed on the first hard mask layer 300. As will be described in more detail later, the reverse layer 400 may be introduced as a layer to be patterned into reverse patterns having a shape inverted from that of the first target pattern 210T in FIG. 1.

The lower reverse layer 410 and the upper reverse layer 420 may include dielectric materials having different etch rates. Depending on etching processes to be performed, the lower reverse layer 410 may have a lower etch rate than the upper reverse layer 420 or, conversely, the upper reverse layer 420 may have a lower etch rate than the lower reverse layer 410. The upper reverse layer 420 may be made of or include, for example, a silicon oxynitride (SiON) layer, and the lower reverse layer 410 may include a spin on coating (SOC) layer.

The lower reverse layer 410 may be formed to have a greater thickness than the upper reverse layer 420. The lower reverse layer 410 may be formed to have a thickness of several hundreds Å to several thousands Å. The lower reverse layer 410 may be formed to a thickness of approximately 1000 Å. The upper reverse layer 420 may be formed to a thickness of several hundred Å. The upper reverse layer 420 may be formed to have a thickness of 200 Å to 300 Å.

Figure 3:
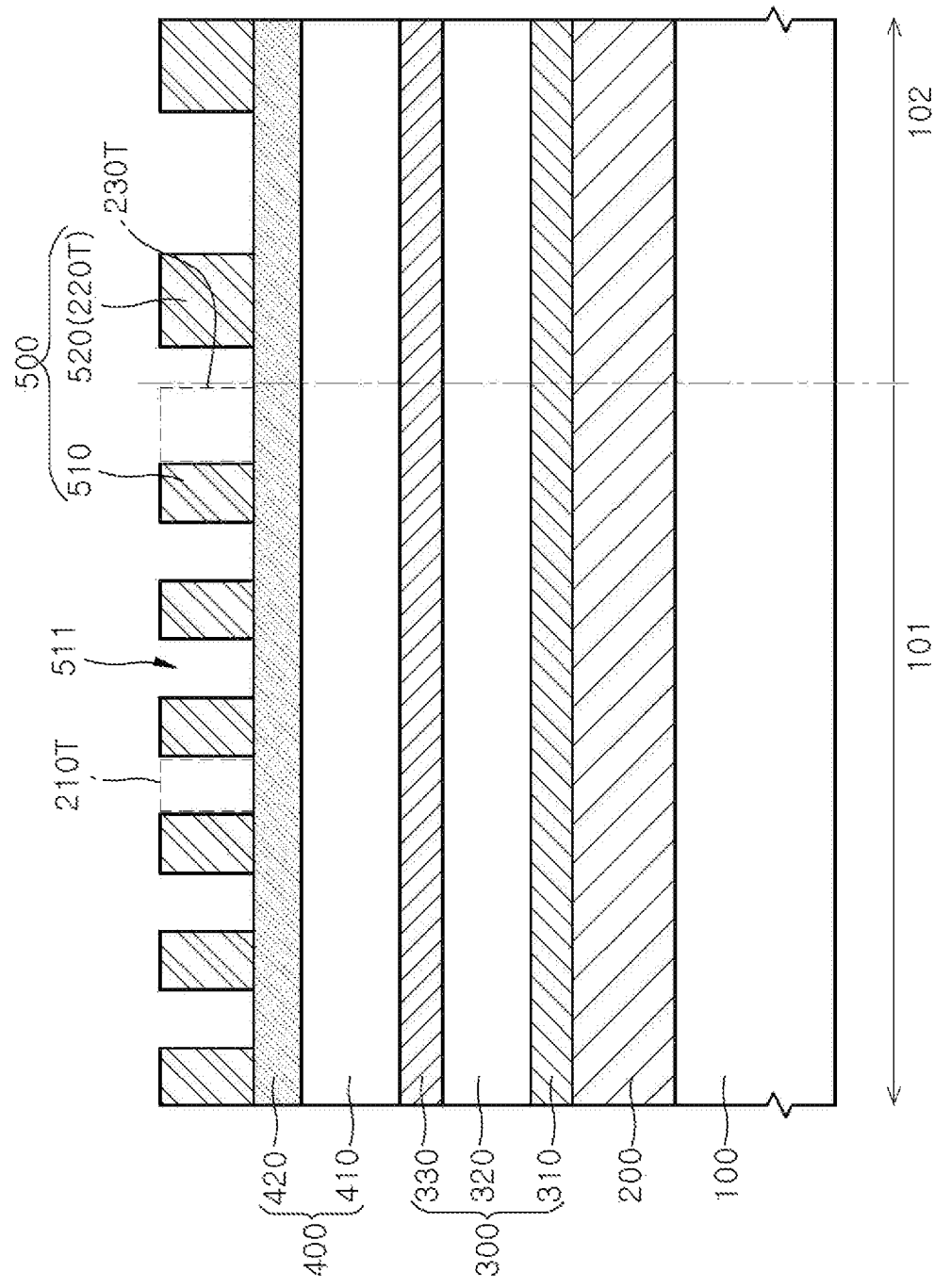

FIG. 3 is a cross-sectional view schematically illustrating a process of forming a photoresist pattern 500 in the method of forming patterns according to an embodiment of the present disclosure.

Referring to FIG. 3, a photoresist material may be coated on the upper reverse layer 420 to form a photoresist layer. A photolithography process may be performed to the photoresist layer to form the photoresist pattern 500. The photolithography process may be performed by an ultraviolet lithography process using extra ultraviolet (EUV) light as an exposure light source. Some portions of the photoresist layer may be exposed and developed to form the photoresist pattern 500 from the photoresist layer. In order to form first photoresist patterns 510 as patterns having a smaller line width than the second photoresist patterns 520, that is, to form the first photoresist patterns 510 as nanoscale patterns, an ultraviolet lithography process may be introduced.

The photoresist pattern 500 may include the first photoresist patterns 510 positioned in the first region 101, and the second photoresist patterns 520 positioned in the second region 102. The first photoresist patterns 510 may be formed as reverse patterns having reversed pattern shapes with respect to the first target patterns 210T. Each of the first target patterns 210T of FIG. 1 may be a pattern having a solid pillar shape, and the first photoresist pattern 510 may be formed in a pattern providing the opening portion 511 of a shape following the shape of the first target pattern 210T. The opening portions 511 of the first photoresist patterns 510 may each have a shape of a hole that substantially vertically penetrates the photoresist layer.

The second photoresist patterns 520 may be formed as patterns having substantially the same solid shape following the solid shape of the second target patterns 220T of FIG. 1. The third target pattern 230T of FIG. 1 may be induced to be formed along an edge of the first photoresist pattern 510 while being attached to the sidewall of the first photoresist pattern 510 in a subsequent process. Therefore, the photoresist pattern 500 might not have a separated solid pattern having a shape reflecting the third target pattern 230T.

Figure 4:
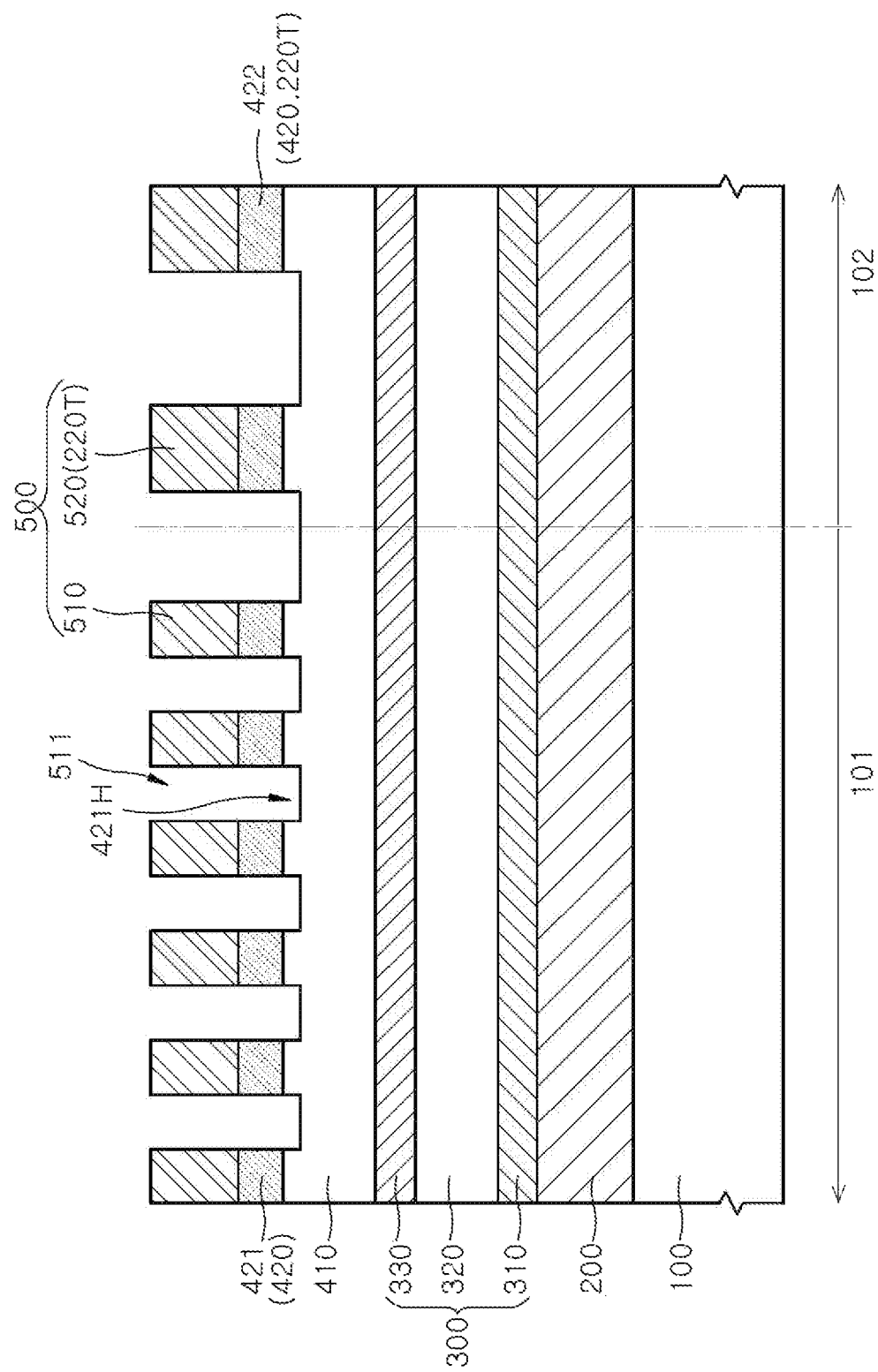
Figure 5:
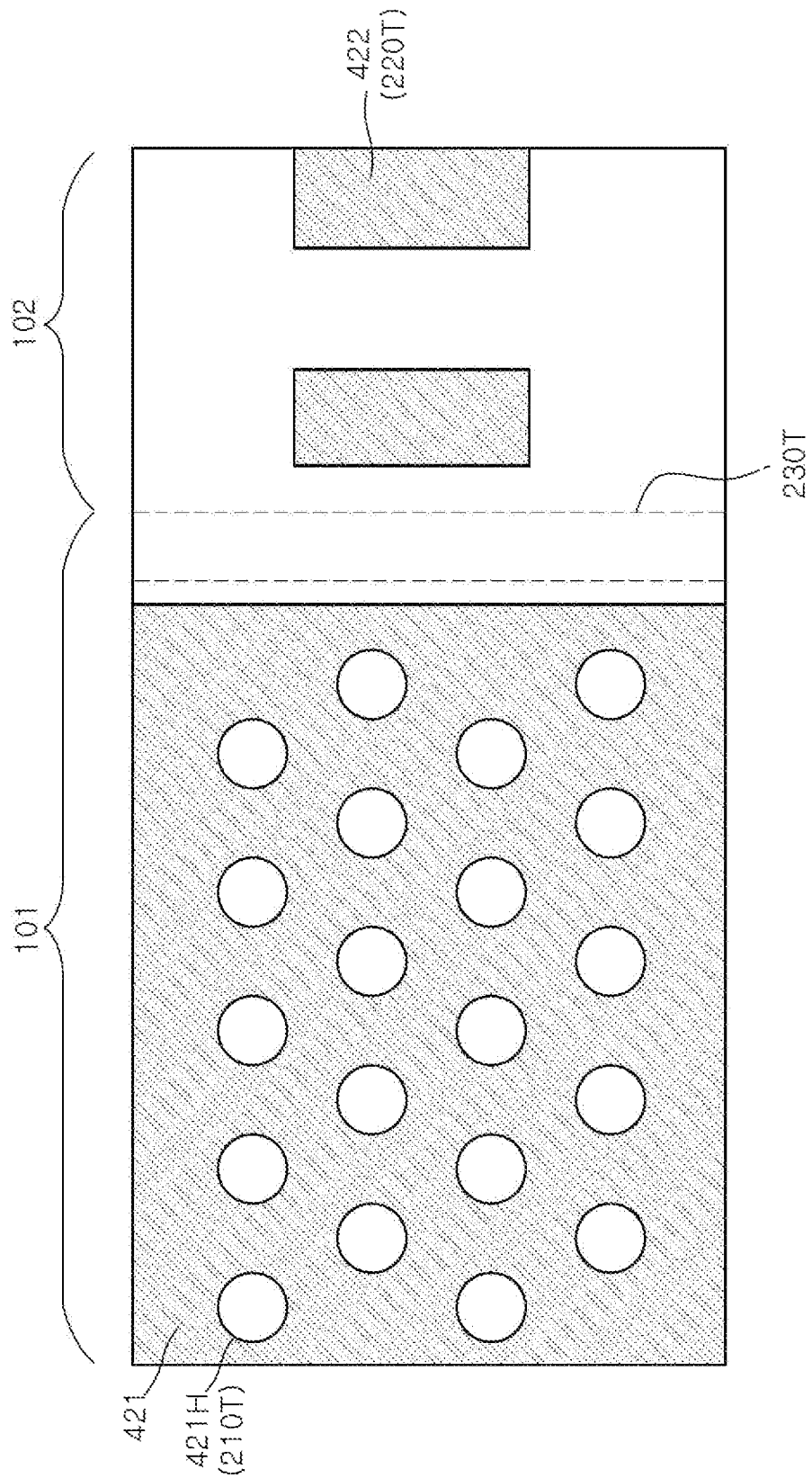

FIGS. 4 and 5 are a cross-sectional view and a plan view, respectively, schematically illustrating a process of forming first upper reverse patterns 421 and second upper reverse patterns 422 in the method of forming patterns according to an embodiment of the present disclosure.

Referring to FIGS. 4 and 5, the portions of the upper reverse layer 420 exposed by the photoresist pattern 500 may be selectively removed to pattern the upper reverse layer 420 by performing an etching process using the photoresist pattern 500 as an etching mask. Accordingly, the first upper reverse patterns 421 having a shape following the shape of the first photoresist pattern 510 may be formed in the first region 101. The second upper reverse patterns 422 having a shape following the shape of the second photoresist pattern 520 may be formed in the second region 102.

The first upper reverse patterns 421 may provide first opening portions 421H having a shape following the shape of the opening portions 511 of the first photoresist pattern 510. The first opening portions 421H of the first upper reverse patterns 421 may each be formed in a shape in which the openings 511 of the first photoresist pattern 510 are extended, and in a position overlapping with the opening portions 511 of the first photoresist pattern 510. The first upper reverse patterns 421 may substantially provide inverted reverse pattern shapes to the first target patterns 210T of FIG. 1. The second upper reverse patterns 422 may substantially provide the shapes of the second target patterns 220T of FIG. 1. The second upper reverse patterns 422 might not reverse patterns of the second target patterns 220T, and may be understood as a term for distinguishing from the first upper reverse patterns 421.

The opening portions 421H of the first upper reverse patterns 421 may each have a different planar shape from the second upper reverse patterns 422. The first opening portions 421H may each have a smaller line width than the second upper reverse patterns 422 and may be disposed in the first region 101 in a relatively denser arrangement. The first opening portions 421H may have substantially the same hole shape. On the other hand, each of the second upper reverse patterns 422 may be a pattern having a rectangular planar shape when viewed in a plane.

The photoresist pattern 500 may serve as an etching mask in an etching process of selectively patterning the first and second upper reverse patterns 421 and 422. The photoresist pattern 500 may be lost by the etching process employed in the selective patterning of the first and second upper reverse patterns 421 and 422. Accordingly, the selective patterning process using the photoresist pattern 500 may be performed such that selective etching is stopped on the lower reverse layer 410. Depending on the degree to which the photoresist pattern 500 is etched and the thickness of the photoresist pattern 500, the thickness of the upper reverse layer 420 may be limited. However, the thickness required for the entire reverse layer (400 in FIG. 3) may be required to be thicker than the thickness of the upper reverse layer (420 in FIG. 3) that can be selectively etched. The lower reverse layer 410 may be introduced under the upper reverse layer 420 in order to compensate for the thickness of the reverse layer 400 that is required to be thicker than the upper reverse layer 420.

Figure 6:
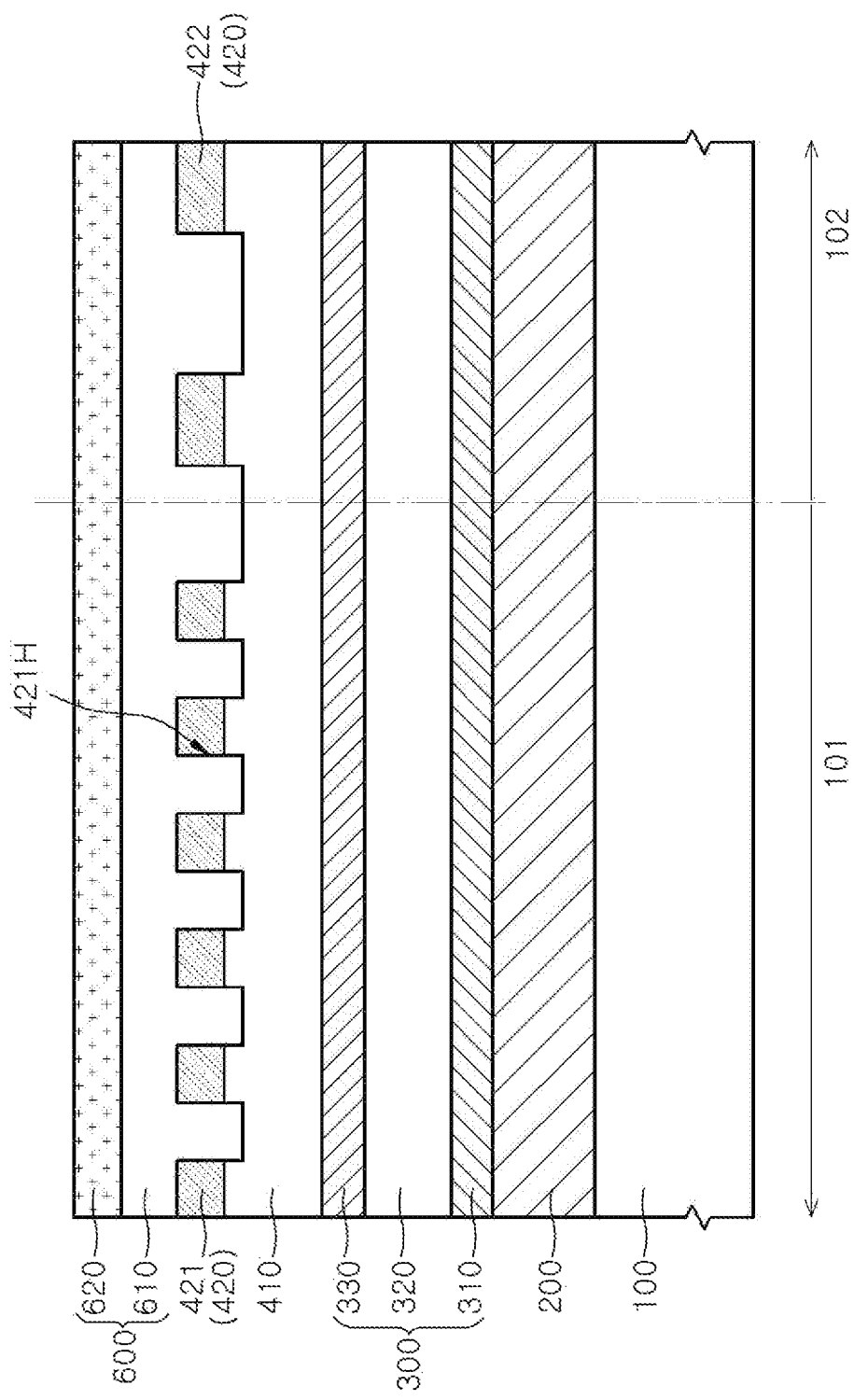

FIG. 6 is a cross-sectional view schematically illustrating a process of forming a buffer layer 600 in the method of forming patterns according to an embodiment of the present disclosure.

Referring to FIG. 6, the buffer layer 600 may be formed to fill the first opening portions 421H and to cover the first and second upper reverse patterns 421 and 422. The buffer layer 600 may be formed as a composite layer including two or more layers. The buffer layer 600 may include a first buffer layer 610 and a second buffer layer 620. The first buffer layer 610 may be formed as a layer extending to cover the first and second upper reverse patterns 421 and 422 while filling the first opening portions 421H. The first buffer layer 610 may be introduced as a layer that mitigates or reduces the process difference or topology caused by the first and second upper reverse patterns 421 and 422. The first buffer layer 610 may be formed as a layer that provides a substantially smooth and flat surface.

The second buffer layer 620 may be a layer thinner than the first buffer layer 610 and may be formed on the first buffer layer 610. The second buffer layer 620 may be introduced as a layer that further mitigates or reduces the process difference or topology caused by the first and second upper reverse patterns 421 and 422. Accordingly, the buffer layer 600 may provide a substantially flat surface state. The second buffer layer 620 may be formed of a dielectric material having a different etch rate from the first buffer layer 610. In the subsequent etching process, the second buffer layer 620 may exhibit an etch rate higher than that of the first buffer layer 610 so that the first buffer layer 610 may act as a layer to terminate the etching process.

The second buffer layer 620 may be formed of substantially the same material as the upper reverse layer 420 and the first and second upper reverse patterns 421 and 422. The second buffer layer 620 may be made of or include, for example, a silicon oxynitride (SiON) layer. The second buffer layer 620 may be formed to have a thickness of approximately several hundred Å. The second buffer layer 620 may be formed to have a thickness of 200 Å to 300 Å. The first buffer layer 610 may be formed of substantially the same material as the lower reverse layer 410. The first buffer layer 610 may be formed as a layer including a spin-on coating (SOC) layer. The first buffer layer 610 may be formed to have a thickness of approximately several hundred Å. The first buffer layer 610 may be formed to have a thickness of 400 Å to 800 Å.

Figure 7:
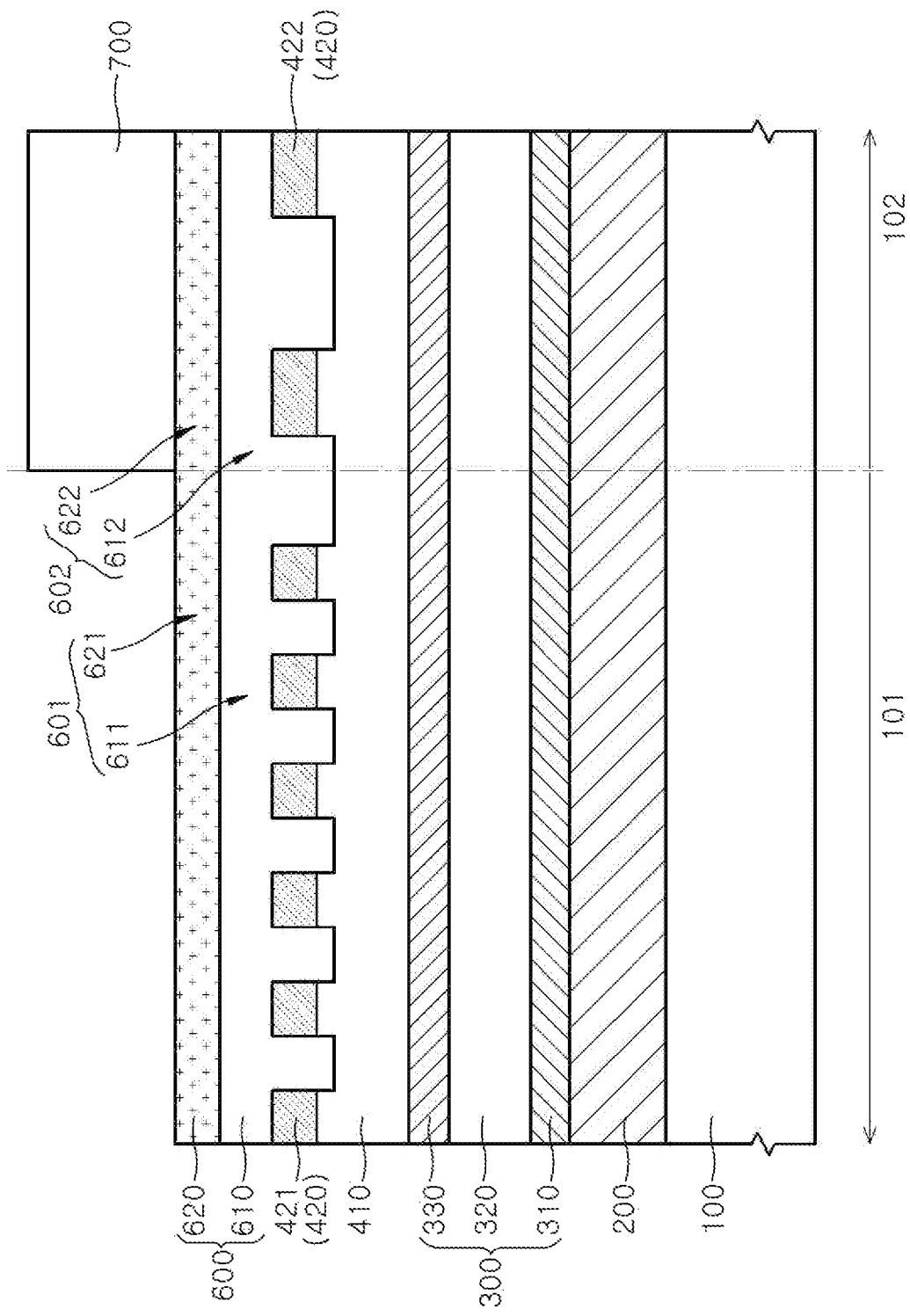

FIG. 7 is a cross-sectional view schematically illustrating a process of forming a shield pattern 700 in the method of forming patterns according to an embodiment of the present disclosure.

Referring to FIG. 7, the shield pattern 700 shielding the second region 102 may be formed on the buffer layer 600. The shield pattern 700 may be formed to cover a buffer layer second portion 602 positioned in the second region 102 while leaving exposed a buffer layer first portion 601 positioned in the first region 101. The buffer layer first portion 601 may be a portion in which the first portion 611 of the first buffer layer 610 and the first portion 621 of the second buffer layer 620 overlap. The buffer layer second portion 602 may be a portion in which the second portion 612 of the first buffer layer 610 and the second portion 622 of the second buffer layer 620 overlap. The shield pattern 700 may be formed as a pattern substantially completely overlapping with the second region 102. The shield pattern 700 may include a layer of a material having a different etch rate from the second buffer layer 620. The shield pattern 700 may be formed of a photoresist material. The shield pattern 700 may be formed of substantially the same dielectric material as the first buffer layer 610. The shield pattern 700 may include a spin-on coating (SOC) layer.

Figure 8:
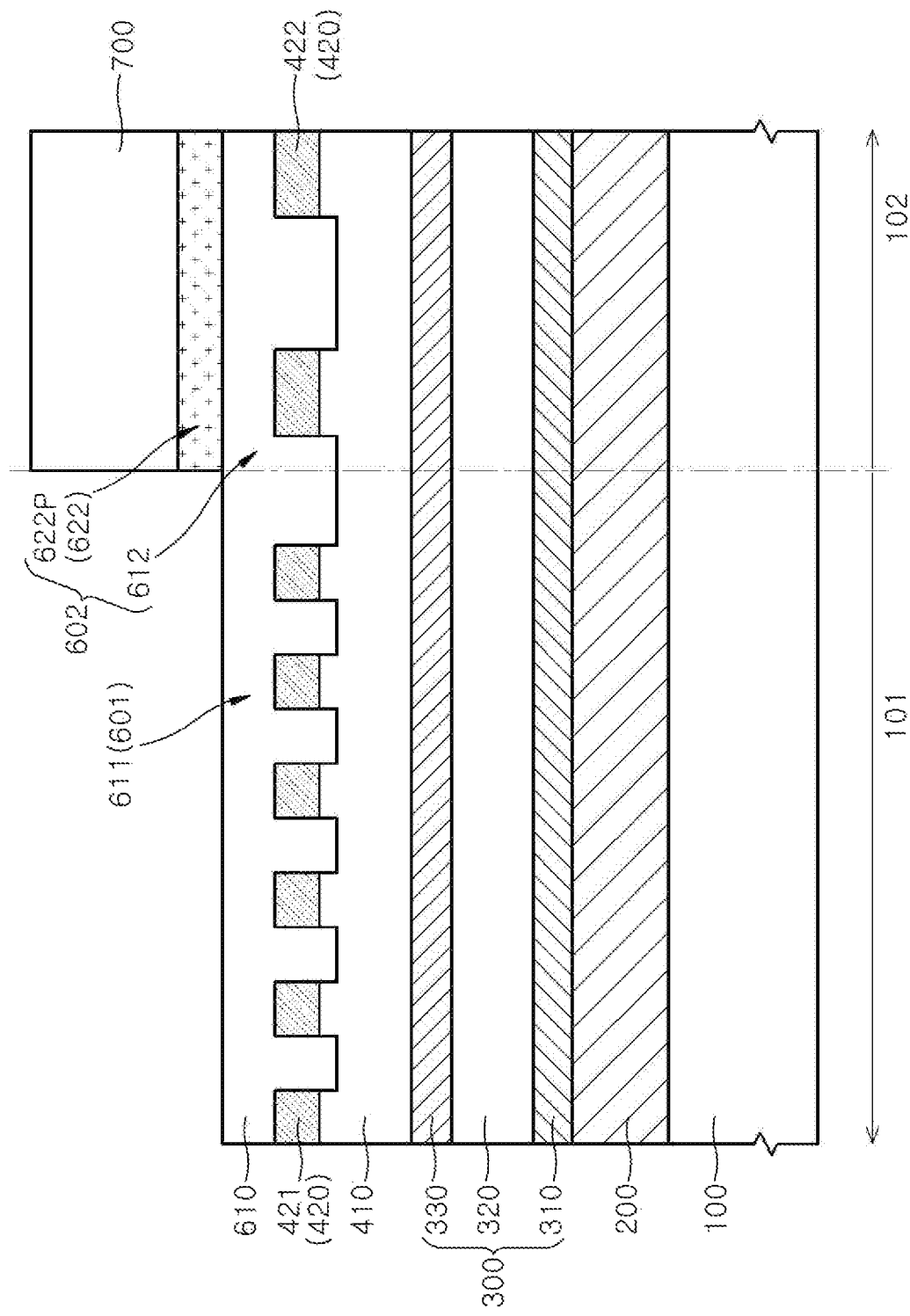
Figure 9:
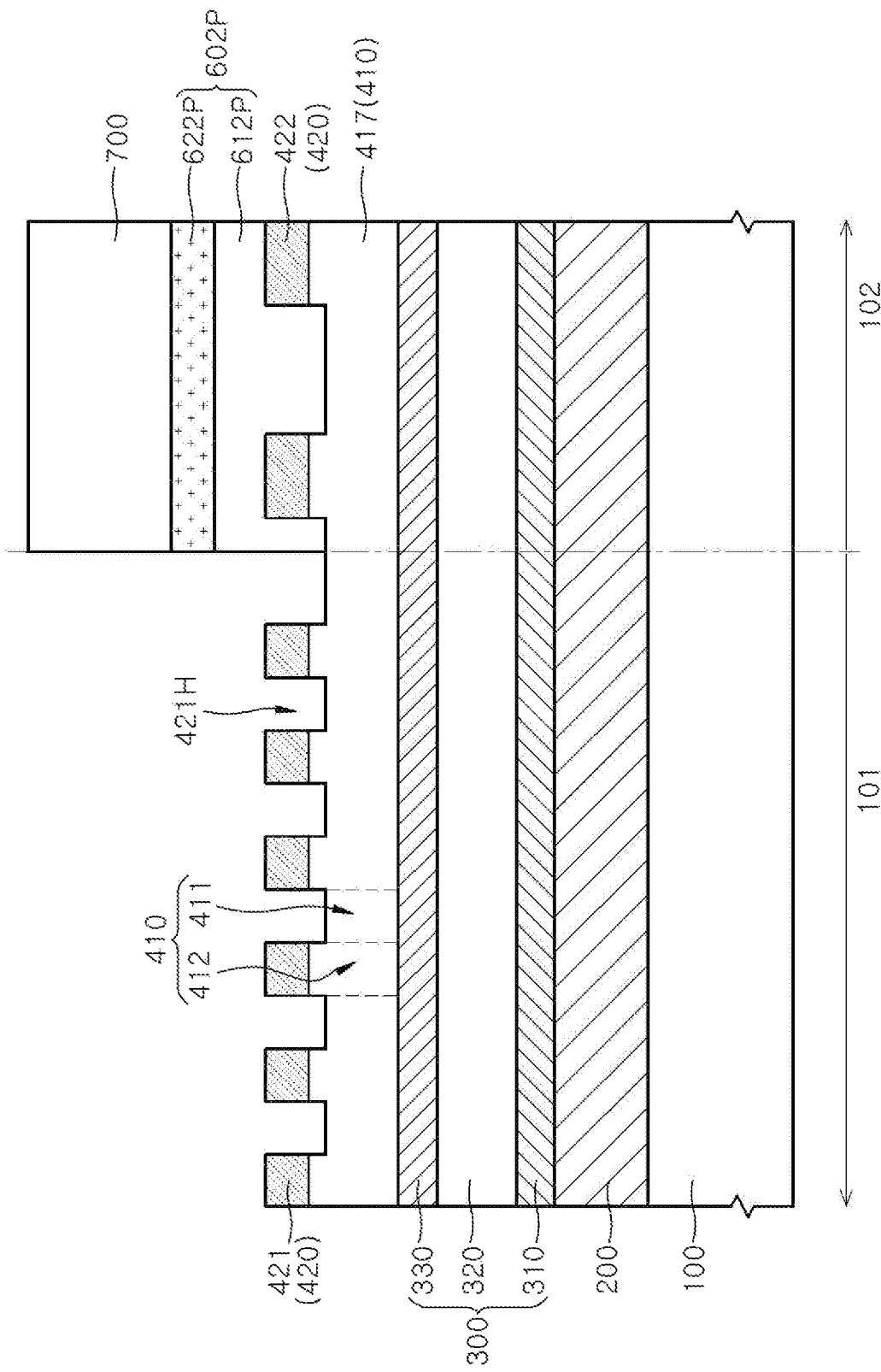
Figure 10:
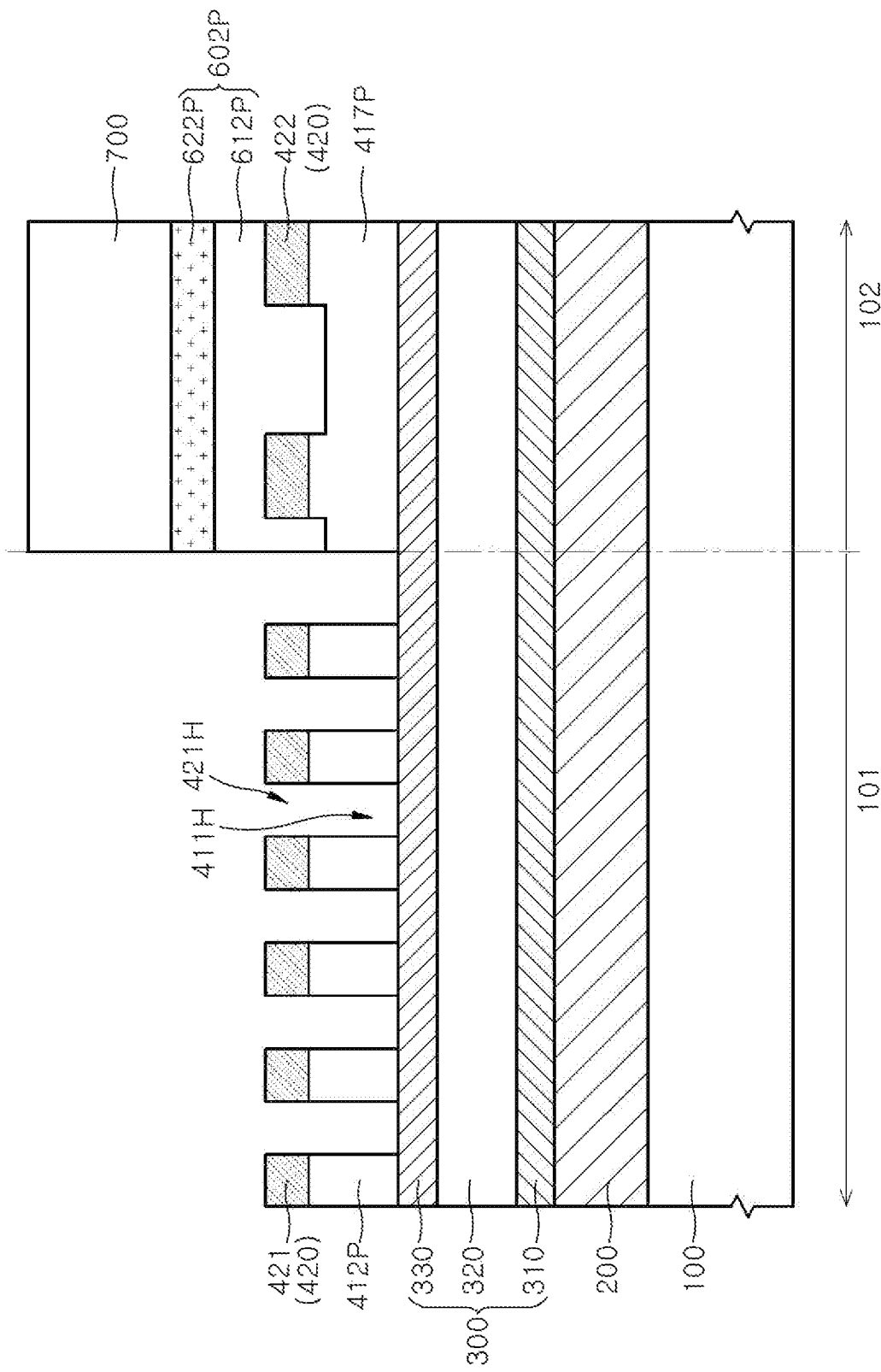

FIGS. 8 to 10 are schematic cross-sectional views sequentially illustrating detailed processes of forming first and second lower reverse patterns 412P and 417P in the method of forming patterns according to an embodiment of the present disclosure. FIG. 8 is a cross-sectional view schematically illustrating a process of removing the first portion 621 of the second buffer layer 620 in the method of forming patterns according to an embodiment of the present disclosure.

Referring to FIG. 8 together with FIG. 7, the second buffer layer first portion 621 of the buffer layer first portion 601, exposed by the shield pattern 700 may be selectively etched and removed by using the shield pattern 700 as an etching mask. Because the shield pattern 700 opens the first region 101, the etching process may be selectively applied only to the second buffer layer first portion 621 positioned in the first region 101. As the second buffer layer first portion 621 is selectively removed, the second buffer layer second portion 622 positioned in the second region 102 may be patterned into a second buffer layer pattern 622P.

FIG. 9 is a cross-sectional view schematically illustrating a process of removing the first portion 611 of the first buffer layer 610 in the method of forming patterns according to an embodiment of the present disclosure.

Referring to FIG. 9 together with FIG. 8, the first buffer layer first portion 611 exposed as the second buffer layer first portion 621 is removed, may be selectively etched and removed. The shield pattern 700 may continue to function as an etching mask. The shield pattern 700 may shield the buffer layer second portion 602 positioned in the second region 102 to protect the buffer layer second portion 602 from etching, even during the process of selectively etching the first buffer layer first portion 611. As the first buffer layer first portion 611 is selectively removed, the first upper reverse patterns 421 may be exposed. As the first buffer layer first portion 611 is selectively removed, the first buffer layer second portion 612 positioned in the second region 102 may be patterned into a first buffer layer pattern 612P. Accordingly, the buffer layer pattern 602P positioned in the second region 102 and substantially overlapping with the second region 102 may be implanted as the first and second buffer layer patterns 612P and 622P. The buffer layer pattern 602P may be formed as a pattern substantially completely overlapping with the shield pattern 700.

The process of selectively etching the first buffer layer first portion 611 may be performed by an etching process having an etching selectivity with respect to the first upper reverse pattern 421. Because the first reverse pattern 421, the first buffer layer 610, and the first buffer layer first portion 611 are formed of different materials having different etch rates, the first upper reverse pattern 421 can resist the etching process and maintain its shape. The first upper reverse pattern 421 may act as a first etching mask for selective etching in the process of selectively removing the buffer layer first portion 601 and the first buffer layer first portion 611 with the shield pattern 700.

As the first buffer layer first portion 611 is selectively removed, the first portions 411 of the lower reverse layer 410 overlapping and positioned under the first opening portions 421H of the first upper reverse pattern 421 may be exposed by the first upper reverse pattern 421. The second portion 412 of the lower reverse layer 410 overlapping and positioned under the first upper reverse pattern 421 may be covered by the first upper reverse pattern 421 and shielded. The second portion 412 of the lower reverse layer 410 may be covered by the first upper reverse pattern 421 and protected from etching. Accordingly, the selective etching can be implemented. The etching process may be performed by an anisotropic etching process.

FIG. 10 is a cross-sectional view schematically illustrating a process of forming first and second lower reverse patterns 412P and 417P in the method of forming patterns according to an embodiment of the present disclosure.

Referring to FIG. 10 together with FIG. 9, as the etching process continues, the first portions 411 of the lower reverse layer 410 may be exposed with respect to the first upper reverse pattern 421 and the shield pattern 700. The etching process using the first upper reverse pattern 421 and the shield pattern 700 as a first etching mask may be continued to selectively remove the exposed first portions 411 of the lower reverse layer 410. Accordingly, second opening portions 411H may be formed in positions where the first portions 411 of the lower reverse layer 410 are removed. The second opening portions 411H may overlap the first opening portions 421H, and may each have a shape in which the first opening portion 421H extends. The second opening portions 411H and the first opening portions 421H may each have a through-hole shape.

As the first portions 411 of the lower reverse layer 410 are selectively removed, the third portion (417 of FIG. 9) of the lower reverse layer 410 located in the second region 102 shielded by the shield pattern 700 may be protected from the selective etching. Accordingly, the third portion (417 of FIG. 9) of the lower reverse payer 410 may be patterned into a second lower reverse pattern 417P. The second lower reverse pattern 417P may have a shape overlapping with the shield pattern 700.

As in the detailed processes depicted in FIGS. 8 to 10, a selective etching process may be performed that substantially uses the shield pattern 700 and the first upper reverse pattern 421 as a first etching mask. The first portion 601 of the buffer layer 600 and the first portion 411 of the lower reverse layer 410 may be sequentially removed to pattern the first lower reverse patterns 412P providing the second opening portions 411H overlapping with the first opening portions 421H. In addition, the buffer layer pattern 602P and the second lower reverse pattern 417P overlapping with the shield pattern 700 may be patterned.

Figure 11:
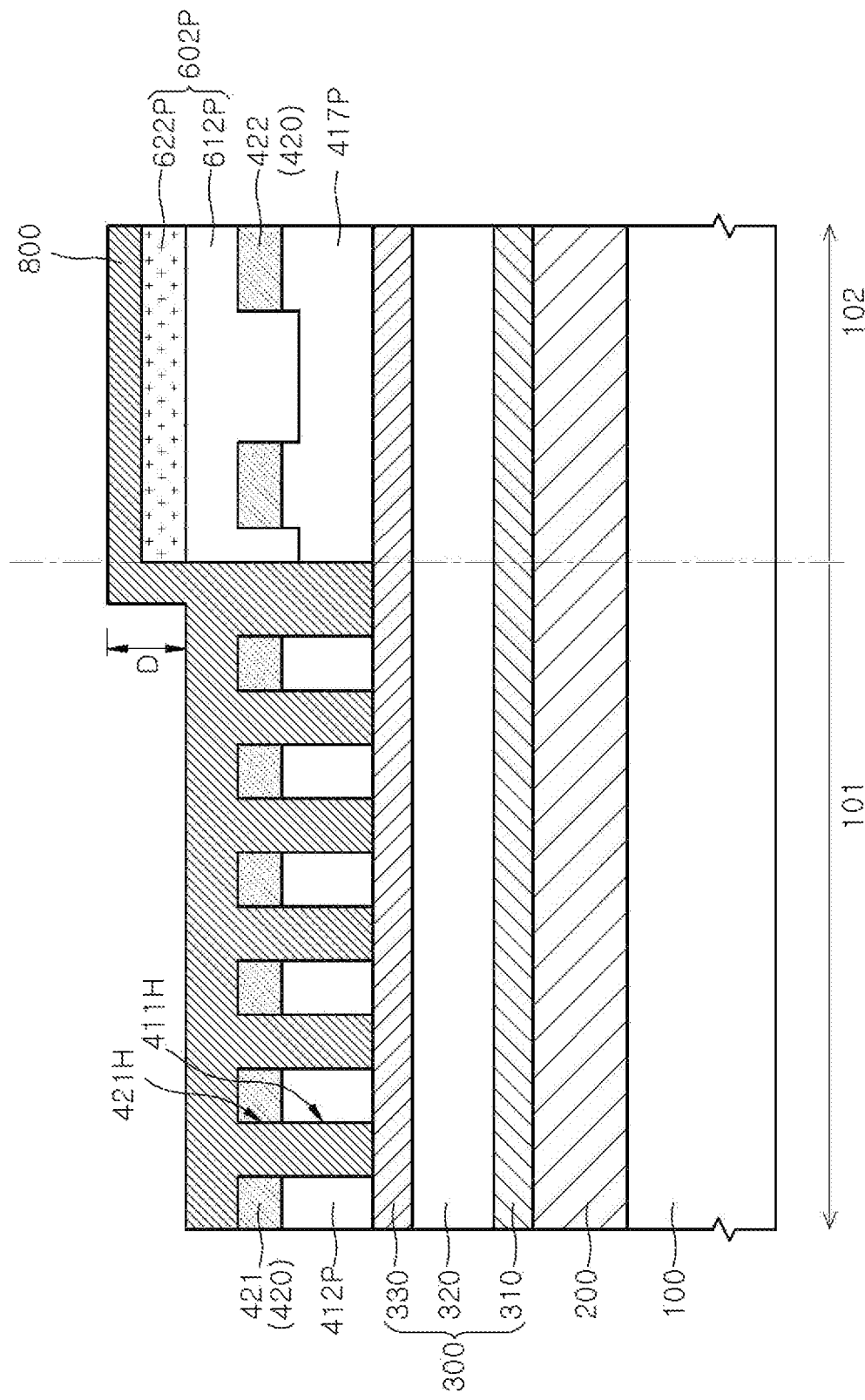

FIG. 11 is a cross-sectional view schematically illustrating a process of forming a second hard mask layer 800 in the method of forming patterns according to an embodiment of the present disclosure.

Referring to FIG. 11, the second hard mask layer 800 may be formed to fill the first and second opening portions 421H and 411H and extend to cover the first upper reverse patterns 421 and the buffer layer pattern 602P. The second hard mask layer 800 may be formed as a layer including a material having a different etch rate from the buffer layer pattern 602P, the upper and lower reverse layers (420 and 410 of FIG. 2), the first lower reverse patterns 412P, and the second lower reverse pattern 417P. The second hard mask layer 800 may be formed of a different dielectric material from the buffer layer pattern 602P, the upper and lower reverse layers (420 and 410 of FIG. 2), the first lower reverse patterns 412P, and the second lower reverse pattern 417P. The second hard mask layer 800 may be formed of a material having a different etch rate from a material constituting the first hard mask layer 300. The second hard mask layer 800 may be formed of a material different from the material constituting the first hard mask layer 300.

The second hard mask layer 800 may be formed of an ultra-low temperature oxide layer. The second hard mask layer 800 may be made of or include a silicon oxide layer. The second hard mask layer 800 may be formed to have a process difference D between the first region 101 and the second region 102. The process difference D may be caused by the buffer layer pattern 602P and the second lower reverse pattern 417P.

Figure 12:
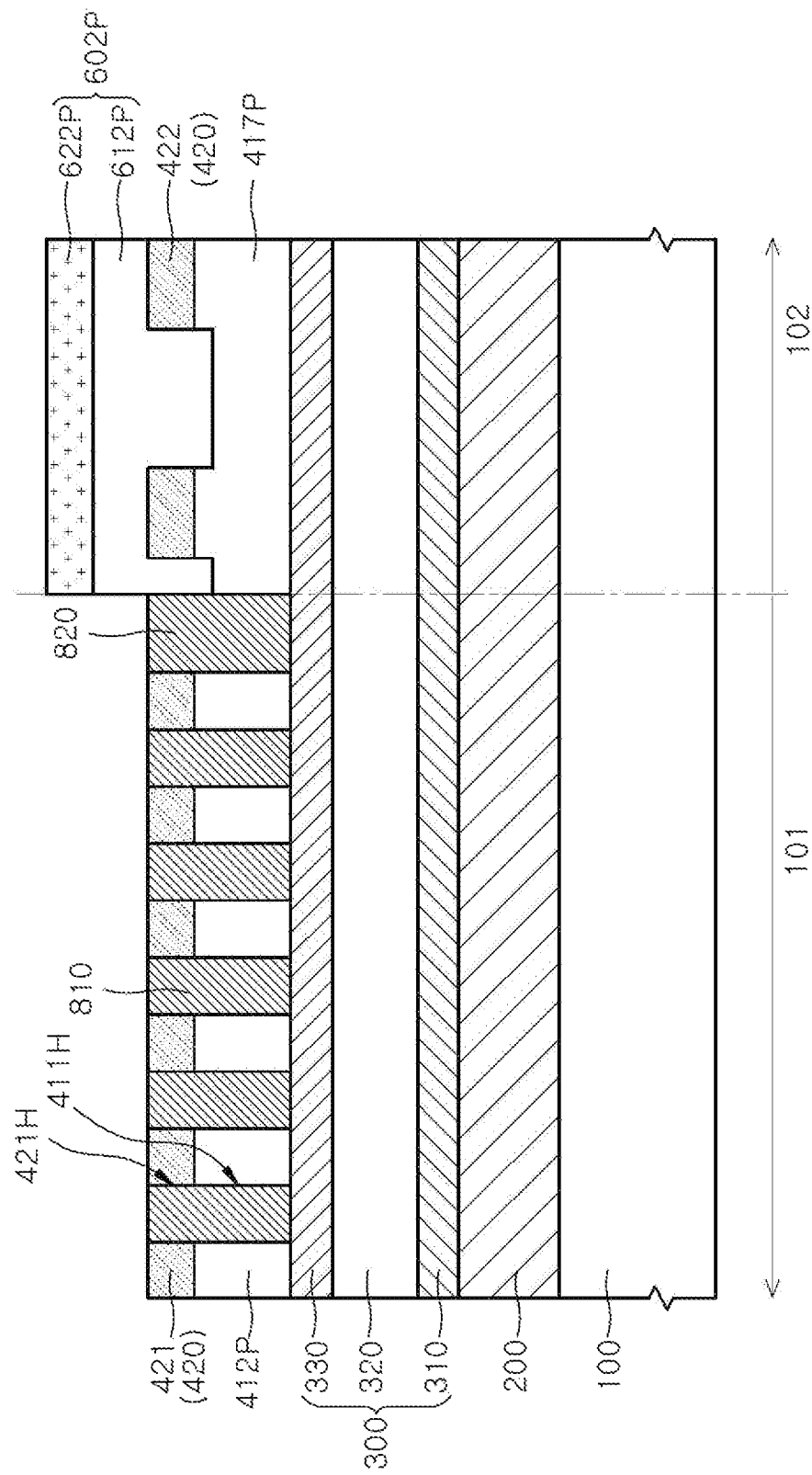

FIG. 12 is a cross-sectional view schematically illustrating a process of forming second had mask first and second patterns 810 and 820 in the method of forming patterns according to an embodiment of the present disclosure.

Referring to FIG. 12 together with FIG. 11, a portion of the second hard mask layer 800 may be removed so that the first upper reverse patterns 421 may be exposed. The second hard mask layer 800 may be removed by a partial thickness so that the upper surface of the first upper reverse patterns 421 and the second buffer layer pattern 622P of the buffer layer pattern 602P may be exposed. The process of removing the second hard mask layer 800 by a partial thickness may be performed through a full etching process or an etch back process. Through this etching process, the second hard mask layer 800 may be separated into second hard mask layer first and second patterns 810 and 820. In this way, in the process of separating the second hard mask layer into the second hard mask layer first and second patterns 810 and 820, a chemical mechanical polishing (CMP) process may be excluded, and a full etching process may be applied. When CMP process is applied, defects in which separation cannot be realized may be caused by the process difference D of the second hard mask layer 800. Because the CMP process is excluded, process defects accompanying the CMP process can be fundamentally prevented.

The second hard mask layer first patterns 810 may be separated into patterns filling the first and second opening portions 421H and 411H. The second hard mask layer second pattern 820 may be separated into a pattern filling a gap between the first upper reverse pattern 421 and the buffer layer pattern 602P. The second hard mask layer first patterns 810 may be separated into patterns having substantially the same pillar shape. The second hard mask layer first patterns 810 may have substantially the same size, shape, and arrangement form as the first target patterns 210T of FIG. 1. The second hard mask layer second pattern 820 may be formed as substantially the same pattern as the third target pattern 230T of FIG. 1. The second hard mask layer second pattern 820 may be a pattern that has a greater line width than the second hard mask layer first pattern 810 and has a bar shape extending long along a boundary between the first region 101 and the second region 102. Because the second hard mask layer second pattern 820 is disposed outside the relatively dense second hard mask layer first patterns 810, there may be a relatively high possibility of collapse in a subsequent etching process. It is more effective that the second hard mask layer second pattern 820 has a greater line width than the second hard mask layer first pattern 810 in order to suppress or reduce the failure of the second hard mask layer second pattern 820 to collapse.

Figure 13:
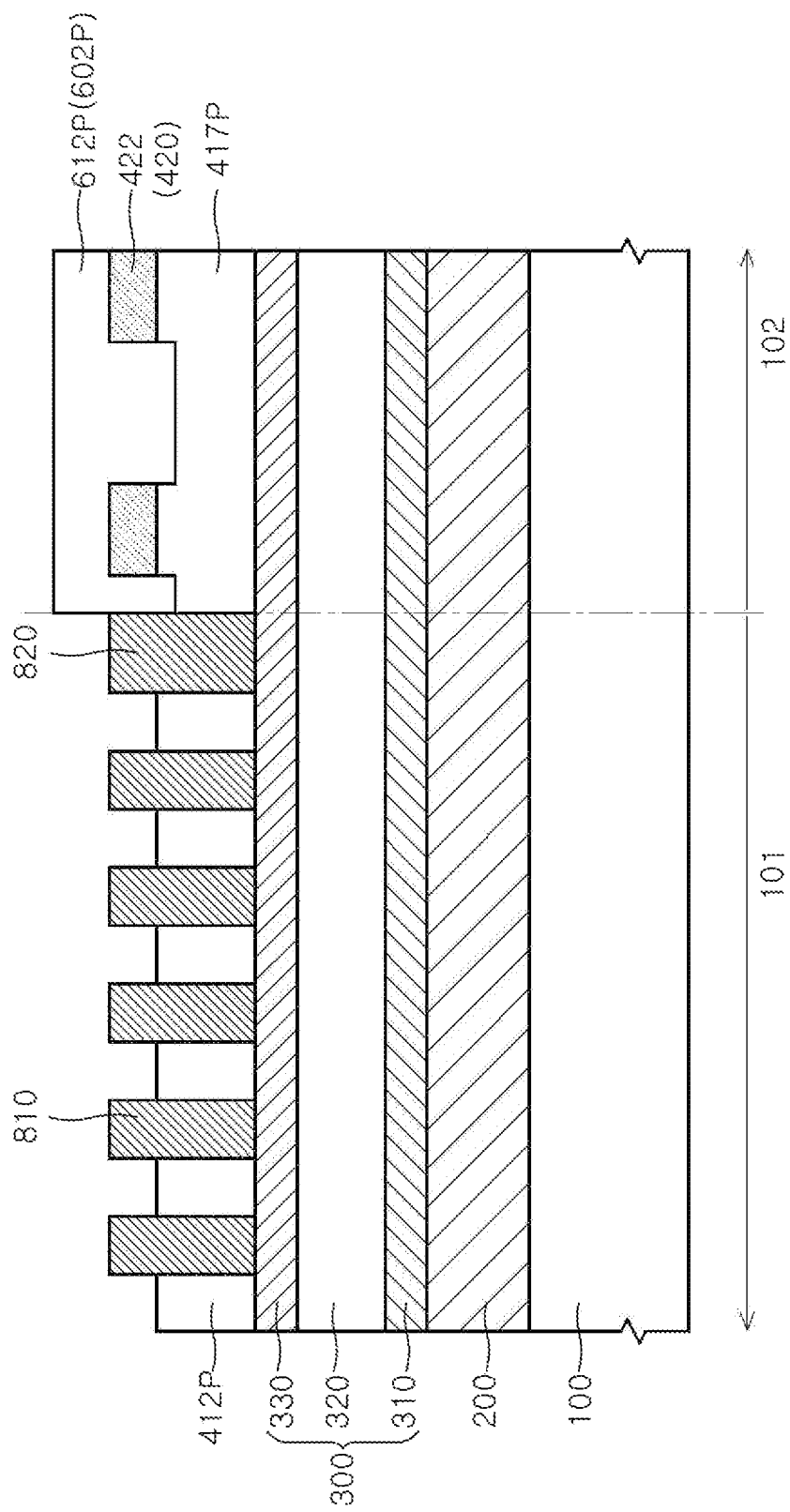

FIG. 13 is a cross-sectional view schematically illustrating a process of selectively removing the first upper reverse patterns 421 in the method of forming patterns according to an embodiment of the present disclosure.

Referring to FIG. 13 together with FIG. 12, an etching process of selectively removing the first upper reverse patterns 421 may be performed. In this etching process, the second buffer layer pattern 622 of the buffer layer pattern 602P may be removed together while the first upper reverse patterns 421 are removed. Accordingly, the upper surfaces of the first lower reverse patterns 412P and the first buffer layer pattern 612P may be exposed.

Figure 14:
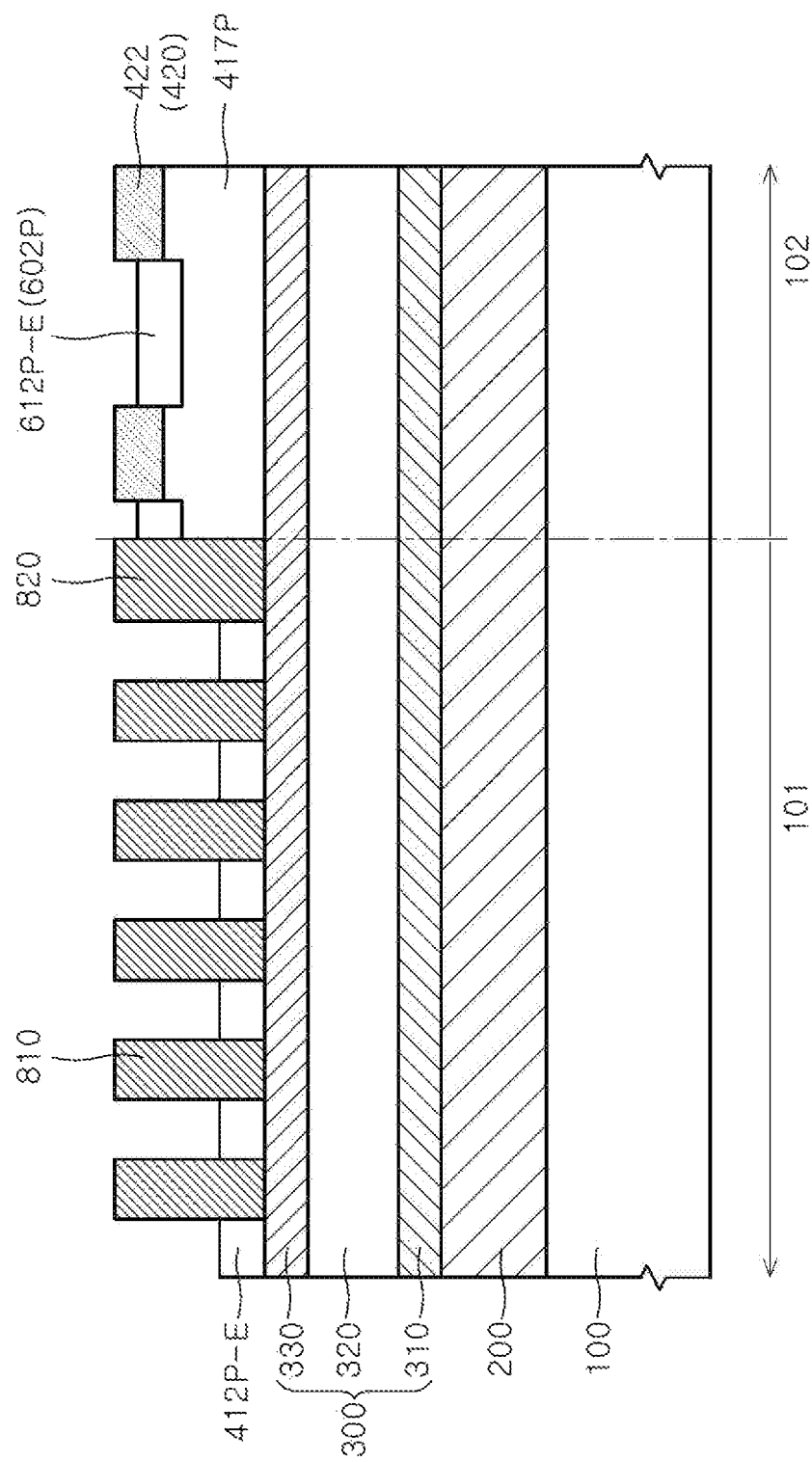
Figure 15:
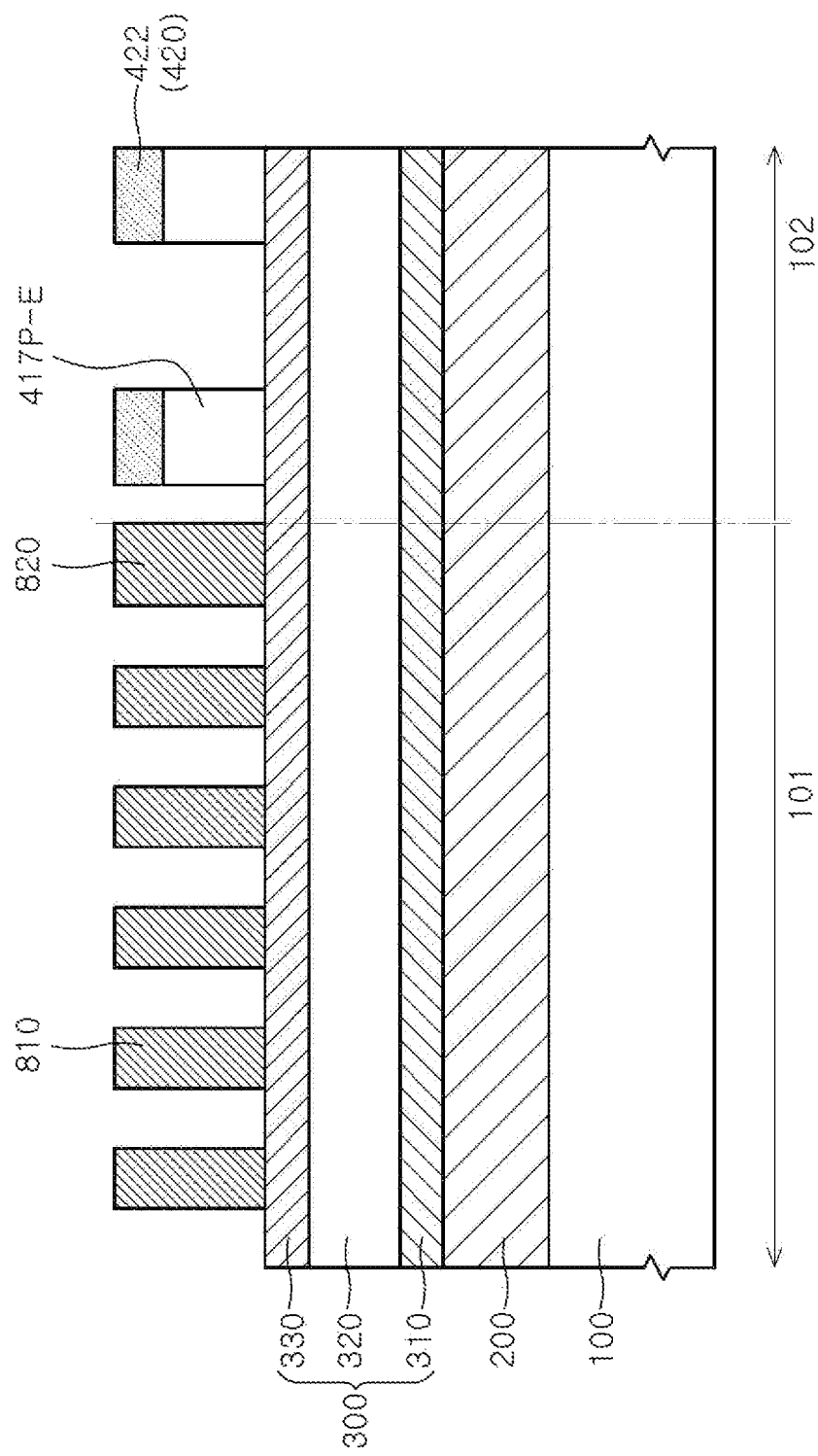

FIGS. 14 and 15 are cross-sectional views schematically and sequentially illustrating detailed processes of forming third lower reverse patterns 417P-E in the method of forming patterns according to an embodiment of the present disclosure. FIG. 14 is a cross-sectional view schematically illustrating a process of removing the first lower reverse patterns 412P and the first buffer layer pattern 612P in the method of forming patterns according to an embodiment of the present disclosure.

Referring to FIG. 14 together with FIG. 13, the first lower reverse patterns 412P and the first buffer layer pattern 612P exposed by the second hard mask layer first and second patterns 810 and 820 may be selectively etched. As the first lower reverse patterns 412P and the first buffer layer pattern 612P are gradually removed by such etching process, the thicknesses of the etched first lower reverse patterns 412P-E and the etched buffer layer patterns 612P-E may be reduced. As the etching process continues, both the etched first lower reverse patterns 412P-E and the etched first buffer layer patterns 612P-E may be removed.

FIG. 15 is a cross-sectional view schematically illustrating a process of patterning the second lower reverse pattern 417P in the pattern forming method according to an embodiment of the present disclosure.

Referring to FIG. 15 together with FIG. 14, as all of the etched first buffer layer patterns 612P-E are removed, some portions of the second upper reverse patterns 422 and the second lower reverse pattern 417P may be exposed. Some portions of the second lower reverse pattern 417P exposed by the second upper reverse patterns 422 may be continuously etched and selectively removed. Accordingly, the third lower reverse patterns 417P-E may be formed as patterns respectively overlapping with the second upper reverse patterns 422. The third lower reverse patterns 417P-E may be patterns separated from the second lower reverse patterns 417P. The third lower reverse patterns 417P-E may be formed as patterns having substantially the same shape as the second target patterns 220T of FIG. 1.

As depicted in FIGS. 14 and 15, the second hard mask layer first and second patterns 810 and 820 and the second upper reverse patterns 422 may be used as a second etching mask for selective etching in an etching process of removing some portions of the buffer layer pattern 602P and the second lower reverse pattern 417P while patterning the third lower reverse patterns 417P-E.

Figure 16:
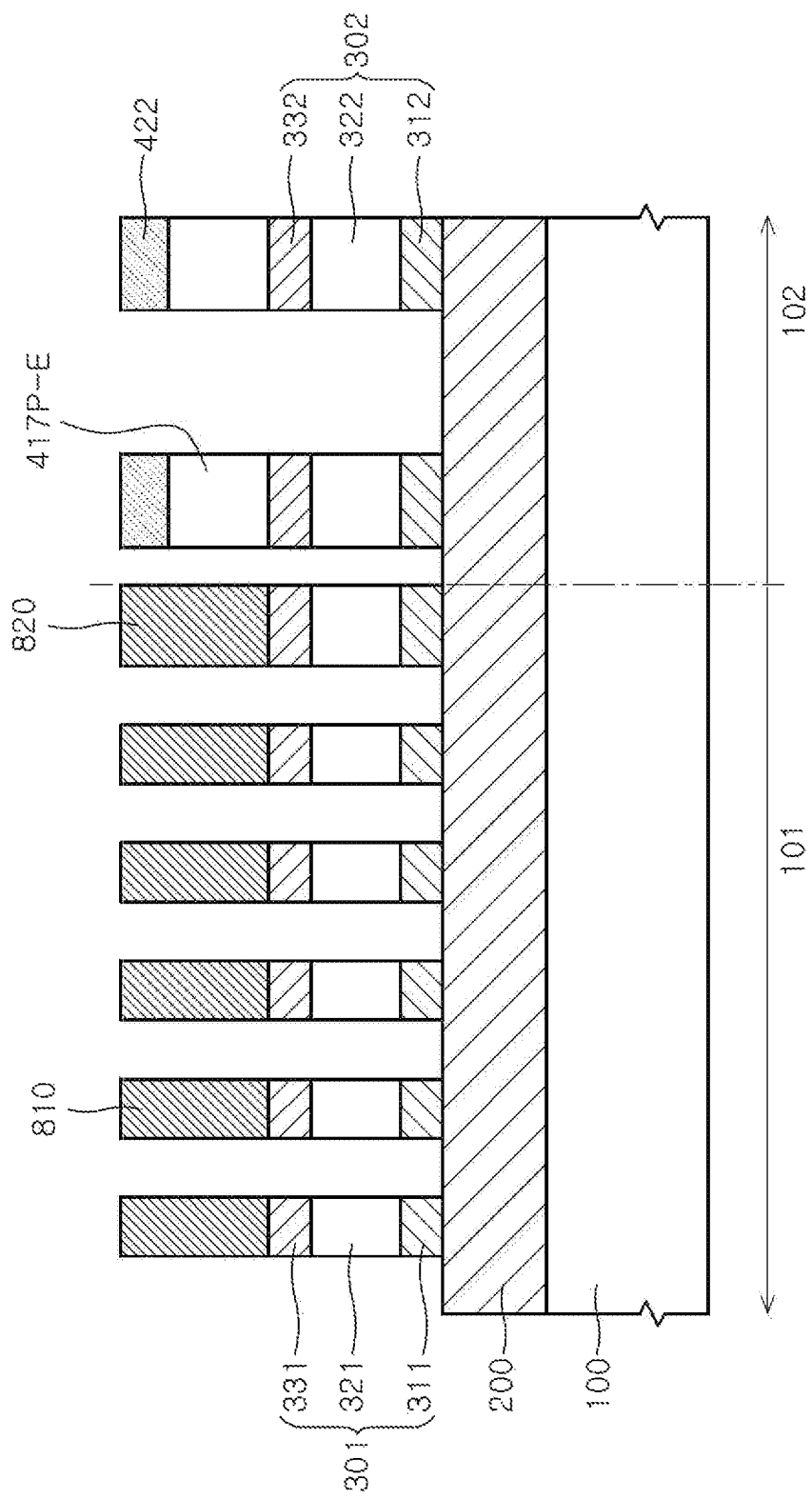

FIG. 16 is a cross-sectional view schematically illustrating a process of patterning the first hard mask layer patterns 301 and 302 in the method of forming patterns according to an embodiment of the present disclosure.

Referring to FIG. 16 together with FIG. 15, the first hard mask layer 300 may be patterned by performing an etching process using the second hard mask layer first and second patterns 810 and 820, the second upper reverse patterns 422, and the third lower reverse patterns 417P-E as an etching mask. Some portions of the first hard mask layer 300 exposed by the second hard mask layer first and second patterns 810 and 820, the second upper reverse patterns 422, and the third lower reverse patterns 417P-E may be selectively removed. Accordingly, first hard mask layer first patterns 301 following the shapes of the second hard mask layer first and second patterns 810 and 820 may be formed in the first region 101, and first hard mask layer second patterns 302 following the shapes of the second upper reverse patterns 422 may be formed in the second region 102.

Figure 17:
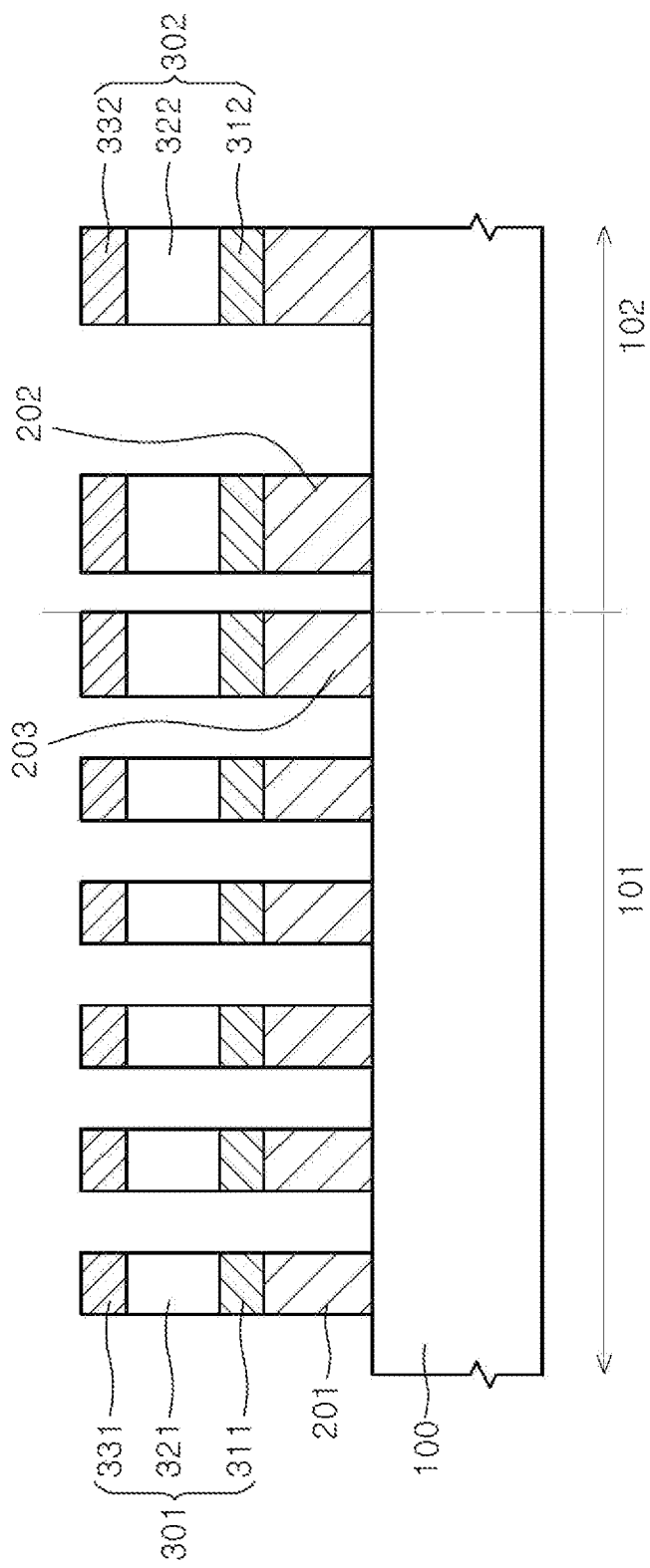
Figure 18:
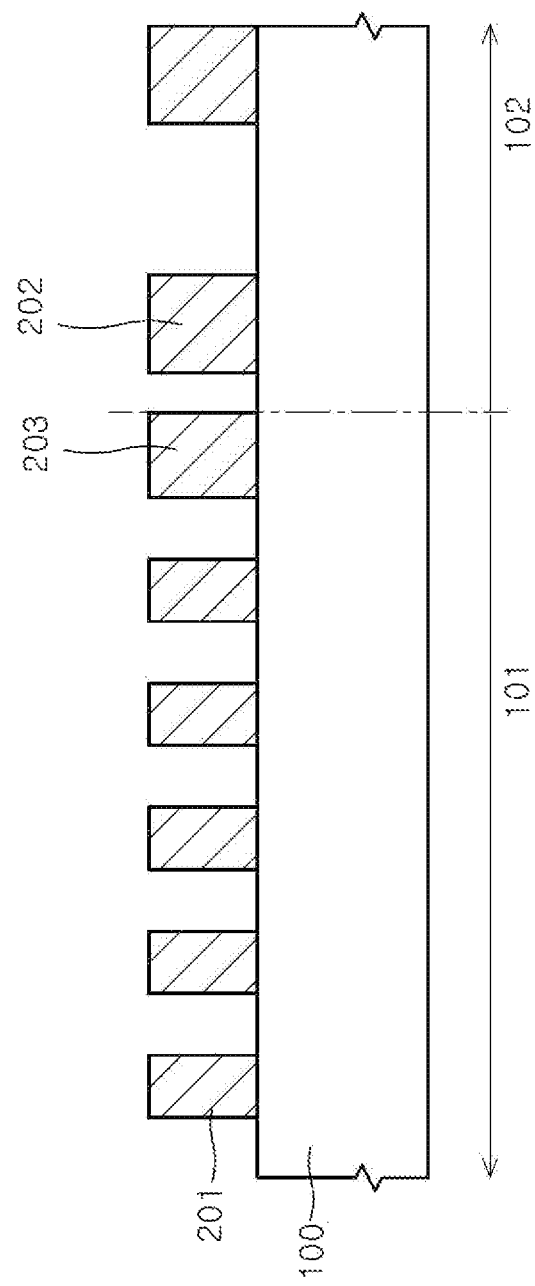

FIGS. 17 and 18 are cross-sectional views schematically illustrating a process of patterning the target layer patterns 201, 202, and 203 in the pattern forming method according to an embodiment of the present disclosure.

Referring to FIG. 17 together with FIG. 16, the first hard mask layer patterns 301 and 302 may be pattern-transferred to the target layer 200. Some portions of the target layer 200 exposed by the first hard mask layer patterns 301 and 302 may be selectively removed using the first hard mask layer patterns 301 and 302 as an etching mask. Accordingly, the target layer patterns 201, 202, and 203 following the shapes of the first hard mask layer patterns 301 and 302 may be formed. Thereafter, as shown in FIG. 18, the first hard mask layer patterns 301 and 302 may be removed. The first target layer patterns 201 may be formed as the first target patterns 210T of FIG. 1, and the second target layer patterns 202 may be formed as the second target patterns 220T. The third target layer pattern 203 may be formed as the third target pattern 230T.

Various embodiments of the present disclosure have been described above. Those skilled in the art will appreciate that various modifications, additions and substitutions are possible, without departing from the scope and spirit of the present disclosure. Accordingly, the embodiments disclosed in the present specification should be considered from not a restrictive standpoint but an illustrative standpoint. The scope of the disclosure are not limited to the above descriptions but defined by the accompanying claims, and all of distinctive features in the equivalent scope should be construed as being included in the concepts.

While the present teachings have been illustrated and described with respect to specific embodiments, it will be apparent to those skilled in the art in light of the present disclosure that various changes and modifications may be made without departing from the spirit and scope of the invention as defined in the following claims.

What is claimed is:

1. A method for forming patterns, the method comprising:
sequentially forming a first hard mask layer, a lower reverse layer, and an upper reverse layer on a semiconductor substrate including first and second regions;
patterning the upper reverse layer into first upper reverse patterns positioned on the first region and second upper reverse patterns positioned on the second region and providing first opening portions between the first upper reverse patterns;
forming a buffer layer covering the first and second upper reverse patterns; forming a shield pattern covering a second portion of the buffer layer positioned on the second region while leaving exposed a first portion of the buffer layer positioned on the first region;
patterning the lower reverse layer and the buffer layer into first lower reverse patterns providing second opening portions respectively overlapping with the first opening portions, and a buffer layer pattern and a second lower reverse pattern overlapping with the shield pattern;
forming second hard mask layer covering the first upper reverse patterns and the buffer layer pattern;
etching the second hard mask layer to form second hard mask layer first patterns filling the first and second opening portions, and a second hard mask layer second pattern filling a space between the first upper reverse pattern and the buffer layer pattern; and
selectively removing the first upper reverse patterns.

2. The method of claim 1, wherein patterning the lower reverse layer and the buffer layer into the first lower reverse patterns, the buffer layer pattern, and the second lower reverse pattern comprises sequentially removing the first portion of the buffer layer and some portions of the lower reverse layer using the shield pattern and the first upper reverse pattern as a first etching mask.

3. The method of claim 1, further comprising:
forming a target layer on the semiconductor substrate;
removing the first power reverse patterns, the buffer layer pattern, and some portions of the second lower reverse pattern using the second hard mask layer first patterns, the second hard mask layer second pattern, and the second upper reverse patterns as a second etching mask to pattern the second lower reverse pattern into third lower reverse patterns overlapping with the second upper reverse pattern;
selectively removing portions of the first hard mask layer exposed by the second hard mask layer first patterns, the second hard mask layer second pattern, and the third lower reverse patterns to pattern the first hard mask layer into first hard mask layer patterns; and
transferring patterns of the first hard mask layer patterns to the target layer.

4. The method of claim 1, wherein each of the first opening portions has a different planar shape from the second upper reverse pattern.

5. The method of claim 1, wherein each of the first opening portions has a smaller line width than the second upper reverse pattern.

6. The method of claim 1, wherein each of the first opening portions has substantially the same hole shape, and each of the second upper reverse patterns has a rectangular planar shape.

7. The method of claim 1, wherein the second hard mask layer first patterns have substantially the same pillar shapes, and
wherein the second hard mask layer second pattern has a greater line width than the second hard mask layer first pattern, and has a shape of a bar extending along a boundary between the first region and the second region.

8. The method of claim 1, wherein the lower reverse layer has a greater thickness than the upper reverse layer.

9. The method of claim 1, wherein the upper reverse layer and the lower reverse layer comprise dielectric materials having different etch rates from each other.

10. The method of claim 9, wherein the upper reverse layer comprises a silicon oxynitride (SiON) layer, and the lower reverse layer comprises a spin on coating (SOC) layer.

11. The method of claim 1, wherein patterning the upper reverse layer into the first and second upper reverse patterns comprises:
forming a photoresist layer on the upper reverse layer;
exposing and developing some portions of the photoresist layer with extreme ultraviolet light to form a photoresist pattern from the photoresist layer; and
transferring a pattern of the photoresist pattern to the upper reverse layer.

12. The method of claim 1, wherein the buffer layer pattern comprises:
a first buffer layer filling the first opening portions and covering the first and second upper reverse patterns; and
a second buffer layer of a dielectric material having a different etch rate than the first buffer layer, the second buffer layer having a thinner thickness than the first buffer layer.

13. The method of claim 12, wherein the second buffer layer comprises the same material as the upper reverse layer, and the first buffer layer comprises the same material as the lower reverse layer.

14. The method of claim 12, wherein the second buffer layer comprises a silicon oxynitride (SiON) layer, and the first buffer layer comprises a spin on coating (SOC) layer.

15. The method of claim 12, wherein the shield layer comprises a material having a different etch rate from the second buffer layer.

16. The method of claim 12, wherein selectively removing the first upper reverse pattern comprises removing the second buffer layer of the buffer layer pattern while removing the first upper reverse pattern.

17. The method of claim 1, wherein the second hard mask layer comprises a material having a different etch rate from the buffer layer pattern and the upper and lower reverse layers.

18. The method of claim 1, wherein the first hard mask layer comprises a material having a different etch rate from the second hard mask layer and the upper and lower reverse layers.

19. The method of claim 1, wherein the first hard mask layer comprises a composite layer including a lower silicon nitride layer, an amorphous carbon layer, and an upper silicon nitride layer.

20. A method for forming patterns, the method comprising:
sequentially forming an upper reverse layer including first and second regions on a lower reverse layer;
patterning the upper reverse layer into first upper reverse patterns providing first opening portions and positioned on the first region, and second upper reverse patterns positioned on the second region;

forming a buffer layer filling the first opening portions and covering the first and second upper reverse patterns;

forming a shield pattern covering a second portion positioned on the second region of the buffer layer while leaving an opening over a first portion positioned on the first region of the buffer layer;

sequentially removing the first portion of the buffer layer and some portions of the lower reverse layer using the shield pattern and the first upper reverse patterns as a first etching mask to form first lower reverse patterns providing second opening portions overlapping with the first opening portions and a buffer layer pattern and a second lower reverse pattern overlapping with the shield pattern;

forming a hard mask layer filling the first and second opening portions and covering the first upper reverse pattern and the buffer layer pattern;

removing some portions of the hard mask layer to expose the first upper reverse pattern and to separate hard mask layer first patterns filling the first and second portions and a hard mask layer second pattern filling a space between the first upper reverse pattern and the buffer layer pattern from the hard mask layer;

selectively removing the first upper reverse pattern; and removing the first lower reverse patterns, the buffer layer pattern and some portions of the second lower reverse pattern using the hard mask layer first patterns, the hard mask layer second pattern, and the second upper reverse patterns as a second etching mask to pattern third lower reverse patterns overlapping with the second upper reverse patterns from the second lower reverse pattern.

* * * * *